United States Patent
Capot et al.

(10) Patent No.: US 11,187,750 B2
(45) Date of Patent: Nov. 30, 2021

(54) METHOD FOR DETECTING THE STATE OF AN ELECTRICAL PROTECTION APPLIANCE IN AN ELECTRICAL INSTALLATION AND DETECTION DEVICE IMPLEMENTING SAID METHOD

(71) Applicant: SOCOMEC, Benfeld (FR)

(72) Inventors: Marc Capot, Kintzheim (FR); Pierre-Henri Herr, Barr (FR); Christian Kern, Kaysersberg Vignoble (FR)

(73) Assignee: SOCOMEC, Benfeld (FR)

( * ) Notice: Subject to any disclaimer, the term of this patent is extended or adjusted under 35 U.S.C. 154(b) by 0 days.

(21) Appl. No.: 16/770,479

(22) PCT Filed: Dec. 6, 2018

(86) PCT No.: PCT/EP2018/083744
§ 371 (c)(1),
(2) Date: Jun. 5, 2020

(87) PCT Pub. No.: WO2019/110711
PCT Pub. Date: Jun. 13, 2019

(65) Prior Publication Data
US 2020/0379045 A1    Dec. 3, 2020

(30) Foreign Application Priority Data

Dec. 7, 2017 (FR) ..................... 1761739

(51) Int. Cl.
*G01R 31/327* (2006.01)
*H01H 71/04* (2006.01)
*G01R 19/25* (2006.01)

(52) U.S. Cl.
CPC ....... *G01R 31/327* (2013.01); *G01R 19/2513* (2013.01); *H01H 71/04* (2013.01); *H01H 2071/042* (2013.01)

(58) Field of Classification Search
None
See application file for complete search history.

(56) References Cited

U.S. PATENT DOCUMENTS 4,996,646 A * 2/1991 Farrington ............... H02H 3/00
700/293
5,189,589 A * 2/1993 Marschall ............. H02H 3/044
327/579

(Continued)

FOREIGN PATENT DOCUMENTS

EP    3033760    6/2016

*Primary Examiner* — Patrick Assouad
*Assistant Examiner* — Haidong Zhang
(74) *Attorney, Agent, or Firm* — Forge IP, PLLC (57) ABSTRACT

A method for detecting the open or closed state of a protection appliance in an electrical installation including a voltage detector upstream of the protection appliance and a voltage detector downstream thereof, in which the voltage data provided by the voltage detectors is used to obtain information regarding the presence or absence of voltage upstream and downstream of the protection appliance, a correlation is established between the voltage data, and it is determined whether the protection appliance is in an open state, in a closed state, in an abnormal state or in an undetermined state. The current data provided by the current detectors can also be used to determine the cause of the tripping of the protection appliance, and to thereby obtain a full, precise and real-time diagnostic for the operation of the electrical installation.

18 Claims, 5 Drawing Sheets

(56) References Cited

U.S. PATENT DOCUMENTS

| | | |
|---|---|---|
| 6,282,499 B1 | 8/2001 | Andersen |
| 2015/0070026 A1 | 3/2015 | Vincent et al. |
| 2015/0091604 A1 | 4/2015 | Danmayr et al. |
| 2017/0269128 A1 | 9/2017 | Bugaris et al. |
| 2017/0336464 A1* | 11/2017 | Blumschein ........... G01R 31/42 |

* cited by examiner

METHOD FOR DETECTING THE STATE OF AN ELECTRICAL PROTECTION APPLIANCE IN AN ELECTRICAL INSTALLATION AND DETECTION DEVICE IMPLEMENTING SAID METHOD

TECHNICAL FIELD

The present invention relates to a method for detecting the open or closed state of an electrical protection appliance in an electrical installation, said installation comprising at least one upstream voltage detector and one downstream voltage detector respectively disposed upstream and downstream of said protection appliance.

It further relates to a device for detecting the open or closed state of an electrical protection appliance in an electrical installation allowing the aforementioned method to be implemented.

BACKGROUND ART

The term "electrical protection appliance" denotes any appliance or member of the circuit breaker, fuse, fused interrupter switch, electromechanical relay, or a similar type, the main function whereof is to protect individuals, loads and electric circuits by automatically cutting the current passing therethrough in the event of a fault such as:

- an overload arising when the power demanded by the circuit exceeds the capacity thereof, generally because too many loads have been connected to the circuit. This results in the cables heating up and a fire risk, or:
- a short-circuit, which is an incidental contact between the phase and neutral in a cable or in a faulty load. If the circuit concerned is not immediately broken, this would result in damage to the installation and electrocution risks for individuals.

An "electrical installation" denotes any cabling installation that is underground, above ground or in a building, for transmitting, from one point to another, the energy from an electrical network to power any electrical energy-consuming load, including the cabling connection to this load. An electrical installation can be single-phase or polyphase and can have a single distribution level or a plurality of ranked distribution levels. In the case of a multi-level electrical installation, a protection appliance is generally provided at each distribution level, respectively in a main switchboard followed by sub-main distribution boards then by final distribution boards. The load can be constituted by any industrial, tertiary or household electrical equipment and appliances.

Maintenance and monitoring operations for an electrical installation require precise, real-time knowledge of the open or closed state of the electrical protection appliances in order to know the operating state of said installation and trigger, where necessary, an intervention by an operator under perfectly safe conditions. On the other hand, if an electrical protection appliance is tripped, the operator must be able to identify the cause thereof in order to remedy it without undue delay. The electrical installations in the industrial and tertiary sectors are generally monitored and controlled by a central monitoring station which may or may not be on the premises. In any case, the data collected, such as the operating parameters of the installation must be transmitted to this central monitoring station via a wired or wireless connection, for example by means of a communication bus, or a communication protocol.

Until now, the only solution for determining the open or closed state of a protection appliance has consisted of having the manufacturer equip the protection appliances with auxiliary contacts dedicated to this function, and of having the user cable these auxiliary contacts to a measuring instrument and/or a controller and/or a central measuring and monitoring station. For this purpose, two auxiliary contacts are required in order to determine the comprehensive state of a protection appliance, namely a first auxiliary contact for determining the physical state of said appliance (open state or closed state) and a second auxiliary contact for determining the cause of the tripping of said appliance: "no trip" or "trip" caused by an overload, a short-circuit, a differential fault, an overvoltage, a reverse power, or any other equivalent cause. Depending on the needs, a single auxiliary contact may suffice depending on whether only the physical state of the appliance or only the cause of tripping must be determined.

This auxiliary contact cabling solution has drawbacks in terms of implementation costs, safety and reliability, in particular in the case of an electrical installation comprising a plurality of protection appliances. More specifically, the operation of cabling the auxiliary contacts involves adding numerous additional cables in the switchboards, which is a complex, tedious and expensive operation capable of leading to errors which would falsify the information collected. Moreover, these additional cables and these auxiliary contacts occupy a large amount of space in the electrical cabinets, which must be dimensioned accordingly. Finally, equipping electrical protection appliances with auxiliary contacts increases the manufacturing cost thereof.

U.S. patent No. 2015/070026 A1 discloses a solution for determining the cause of a voltage outage downstream from a circuit breaker by means of an auxiliary appliance connected by cabling to the circuit breaker on the load side. The auxiliary appliance comprises a current sensor and a voltage sensor for measuring the intensity and the voltage downstream of the circuit breaker in order to detect a voltage outage downstream of the circuit breaker and determine the cause of this voltage outage by analysing the heating-up calculated from the current measurement allowing it to be identified whether the cause originates from an electric overload, a short-circuit or a voltage sag. This solution proposes a very incomplete diagnostic for the installation that can even be dangerous to individuals since certain faults are not identified. More specifically, it does not allow the open or closed state of the protection appliances to be detected, which states constitute essential data for accurately determining, in real time, the operating state of an installation and for triggering, where necessary, an intervention by an operator under perfectly safe conditions. Furthermore, this solution does not overcome the problems regarding cabling.

U.S. patent No. 2017/269128 A1 proposes a solution for detecting the absence of voltage upstream of a circuit breaker using an auxiliary testing device permanently connected by cabling in the installation, in order to check for the absence of electrical risks before accessing the installation. Although one of the solutions described provides for improving the capabilities of the testing device by detecting the presence and absence of voltage upstream and downstream of the circuit breaker by means of one or more testing devices, it also does not allow a comprehensive, accurate, real-time diagnostic to be obtained since it does not allow the physical state of the circuit breaker to be identified. More specifically, the absence of voltage upstream of a circuit breaker is not sufficient to conclude the absence of electrical hazards and can lead to high risks for individuals. Furthermore, this solution does not overcome the problems regarding cabling.

There is currently no other comprehensive solution for overcoming these problems.

DISCLOSURE OF INVENTION

The present invention aims to overcome these drawbacks by proposing a novel detection method that does away with the need for auxiliary contacts and thus with the cabling inherent to these auxiliary contacts, thereby procuring a more cost-effective and light-weight detection solution, the implementation whereof is simplified and faster, since it no longer requires auxiliary contact cabling, the results obtained for which are inevitably more reliable since there is no longer any risk of cabling errors, and which allows additional information to be obtained regarding the causes of a trip. The design and the cost of the electrical protection appliances can thus be optimised, as well as those of the switchboards, the overall dimensions whereof can be reduced. Moreover, the implementation of the invention in multi-level electrical installations is made significantly simpler.

For this purpose, the invention relates to a detection method of the type specified in the preamble, characterised in that the voltage data provided by said voltage detectors is used to obtain information regarding the presence or absence of voltage upstream and regarding the presence or absence of voltage downstream of said protection appliance, in that a correlation is established between said voltage data, and in that it is determined whether said protection appliance is in an open state, in a closed state, in an abnormal state or in an undetermined state.

If the electrical protection appliance comprises a plurality of poles and said installation comprises, on each of the poles, an upstream voltage detector and a downstream voltage detector respectively disposed upstream and downstream of said protection appliance, then the voltage data provided by said voltage detectors pole by pole can be used to obtain information regarding the presence or absence of voltage upstream of said protection appliance and regarding the presence or absence of voltage downstream of said protection appliance, the voltage data can be compared pole by pole, and it can further be determined whether said protection appliance is in an incomplete open state.

If the electrical installation comprises a number N of electrical protection appliances, a single upstream voltage detector can be disposed upstream of the N protection appliances, and a downstream voltage detector can be disposed downstream of each of the N protection appliances, then the voltage data provided by said voltage detectors can be advantageously used to obtain information regarding the presence or absence of the common voltage upstream of the N protection appliances and regarding the presence or absence of the individual voltage downstream of each of the N protection appliances, and the individual state of each of the N protection appliances can thus be determined.

If the electrical installation comprises two ranked distribution levels, a first level powered by a main switchboard and a second level powered by a final distribution board, each distribution level comprising at least one electrical protection appliance, said installation comprising a single upstream voltage detector disposed upstream of said at least one protection appliance of the first level and a downstream voltage detector disposed downstream of said at least one protection appliance of the second level, then the voltage data provided by said voltage detectors can be used to obtain information regarding the presence or absence of the common voltage upstream of said first level and regarding the presence or absence of voltage downstream of said second level, and the individual state of at least a part of said protection appliances can thus be determined.

If said electrical installation comprises a number X of ranked distribution levels, a first level powered by a main switchboard, a number X-2 of intermediate levels powered by sub-main distribution boards, and a final level powered by a final distribution board, each distribution level comprising at least one electrical protection appliance, said installation comprising a single upstream voltage detector disposed upstream of said at least one protection appliance of the first level and a downstream voltage detector disposed downstream of said at least one protection appliance of the final level, then the voltage data provided by said voltage detectors can be used to obtain information regarding the presence or absence of the common voltage upstream of said first level and regarding the presence or absence of voltage downstream of said final level, and the individual state of at least a part of said protection appliances can thus be determined.

In this type of installation, a downstream voltage detector can also be provided, disposed downstream of said at least one protection appliance of each intermediate level, further allowing the voltage data provided by said voltage detectors to be used to obtain information regarding the presence or absence of voltage downstream of said at least one protection appliance of each intermediate level, and the individual state of each of said protection appliances of said intermediate levels can thus be determined.

Said upstream voltage detector and said downstream voltage detector can be chosen from voltage presence sensors and/or voltage measurement sensors, and voltage images viewed and/or voltage values measured by said voltage detectors can thus be used. Preferably, non-contact sensors are used as the upstream voltage detector and/or downstream voltage detector.

If said electrical installation comprises a current measuring device downstream of at least one protection appliance, then the current value measured by said current measuring device can be used to determine the cause of the opening of said protection appliance between a deliberate opening and an accidental opening caused by an overload or a short-circuit.

Depending on the type of voltage detector, a voltage threshold can be set, below which the voltage upstream and/or downstream of said protection appliance is considered to be absent. A voltage value measured by said corresponding voltage detector can also be used, and said measured voltage value can be compared with said voltage threshold. A current value measured by said current measuring device can also be used to determine, by calibration, a nominal value of the voltage upstream and/or downstream of said protection appliance and to set said voltage threshold based on this nominal voltage value.

For the same purpose, the invention relates to a detection device of the type specified in the preamble, designed to implement said detection method defined hereinabove and characterised in that it comprises a processing unit designed to use the voltage data provided by said voltage detectors and obtain information regarding the presence or absence of voltage upstream and regarding the presence or absence of voltage downstream of said protection appliance, a module for correlating said voltage data, designed to determine whether said protection appliance is in an open state, in a closed state, in an abnormal state or in an undetermined state, and communication means designed to transmit information regarding the state of said protection appliance to a central monitoring station.

If the electrical protection appliance comprises a plurality of poles and the installation comprises, on each of the poles, an upstream voltage detector and a downstream voltage detector respectively disposed upstream and downstream of said protection appliance, the processing unit is advantageously designed to use the voltage data provided by the voltage detectors pole by pole, and obtain information regarding the presence or absence of voltage upstream and regarding the presence or absence of voltage downstream of said protection appliance, and the module for correlating the voltage data is, in this case, advantageously designed to compare the voltage data pole by pole and further determine whether the protection appliance is in an incomplete open state.

If the electrical installation comprises a number N of electrical protection appliances, a single upstream voltage detector disposed upstream of the N protection appliances designed to provide a voltage common to said protection appliances, and a downstream voltage detector disposed downstream of each of the N protection appliances, the processing unit is advantageously designed to use the voltage data provided by the voltage detectors and obtain information regarding the presence or absence of the common voltage upstream of the N protection appliances and regarding the presence or absence of the individual voltage downstream of each of the N protection appliances, and the correlation module is, in this case, advantageously designed to determine the individual state of each of the N protection appliances.

If the electrical installation comprises two ranked distribution levels, a first level powered by a main switchboard and a second level powered by a final distribution board, each distribution level comprising at least one electrical protection appliance, the installation comprising a single upstream voltage detector disposed upstream of said at least one protection appliance of the first level and a downstream voltage detector disposed downstream of said at least one protection appliance of the second level, the processing unit is advantageously designed to use the voltage data provided by the voltage detectors and obtain information regarding the presence or absence of the common voltage upstream of said first level and regarding the presence or absence of voltage downstream of said second level, and the correlation module is, in this case, advantageously designed to determine the individual state of at least a part of said protection appliances.

If the electrical installation comprises a number X of ranked distribution levels, a first level powered by a main switchboard, a number X-2 of intermediate levels powered by sub-main distribution boards, and a final level powered by a final distribution board, each distribution level comprising at least one electrical protection appliance, the installation comprising a single upstream voltage detector disposed upstream of said at least one protection appliance of the first level and a downstream voltage detector disposed downstream of said at least one protection appliance of the final level, the processing unit is advantageously designed to use the voltage data provided by the voltage detectors and obtain information regarding the presence or absence of the common voltage upstream of said first level and regarding the presence or absence of voltage downstream of said final level, and the correlation module is, in this case, advantageously designed to determine the individual state of at least a part of said protection appliances.

If the installation further comprises a downstream voltage detector disposed downstream of said at least one protection appliance of each intermediate level, the processing unit is advantageously designed to further use the voltage data provided by the voltage detectors and obtain information regarding the presence or absence of voltage downstream of said at least one protection appliance of each intermediate level, and the correlation module is, in this case, advantageously designed to determine the individual state of each of the protection appliances of each of the intermediate levels.

According to the alternative embodiments of said detection device, said upstream voltage detector and said downstream voltage detector can be voltage presence sensors and/or voltage measurement sensors, and said processing unit is, in this case, designed to use voltage images viewed and/or voltage values measured by said voltage detectors. Preferably, said upstream voltage detector and/or said downstream voltage detector are non-contact sensors.

If said electrical installation comprises a current measuring device disposed downstream of at least one protection appliance, then said processing unit is advantageously designed to use the current value measured by said current measuring device and further comprises a comparison unit designed to compare said current value measured with different current thresholds to determine the cause of the opening of said protection appliance from a deliberate opening and an accidental opening caused by an overload or a short-circuit.

In one preferred embodiment of the invention, the processing unit comprises a module for determining the presence of voltage designed to identify, from said voltage data provided by said voltage detectors, whether each of the voltages is present or absent. Said module for determining the presence of voltage can be designed to compare said voltage data provided by said voltage detectors with a voltage threshold value below which the voltage is considered to be absent.

Preferentially, said correlation module comprises at least one truth table corresponding to at least one type of protection appliance for determining, as a function of the presence or absence of said voltages, whether said protection appliance is in an open state, a close state or an error state.

In one advantageous alternative embodiment, said processing unit can further comprise a synchronisation module designed to bring into line the sampling frequency of said voltage and current data provided by said voltage detectors and by said current measuring device.

Thus, this novel detection method and the detection device for implementing same have advantages linked to the absence of cabling for auxiliary contacts or dedicated appliances compared to the solutions of the prior art, which are in particular:
  reduced costs (no more need for auxiliary contacts, no more need for cabling)
  less space required in the switchboard
  minimised connection errors
  an interpretation of the cause of the trip thanks to direct current analysis
  increased accuracy and reliability of the information detected as a result of the eliminated cabling.

Moreover, the solution of the invention is a comprehensive solution that allows for a full, accurate and real-time diagnostic of the installation, capable of mapping the installation, in particular when it comprises a plurality of distribution levels, in order to be able to safely intervene in a highly targeted manner, thus saving time and improving efficiency.

BRIEF DESCRIPTION OF DRAWINGS

The present invention and the advantages thereof will appear more clearly in the following description of one embodiment given for purposes of illustration only and not intended to limit the scope of the invention, with reference to the accompanying drawings, wherein.

ILLUSTRATIONS OF THE INVENTION AND BEST MODES FOR CARRYING OUT THE INVENTION

In the example embodiments shown, identical elements or parts bear the same reference numerals.

The method for detecting the open or closed state of a protection appliance according to the invention differs from that of the prior art by the absence of auxiliary contacts and the cabling associated with said auxiliary contacts.

Figure 1:
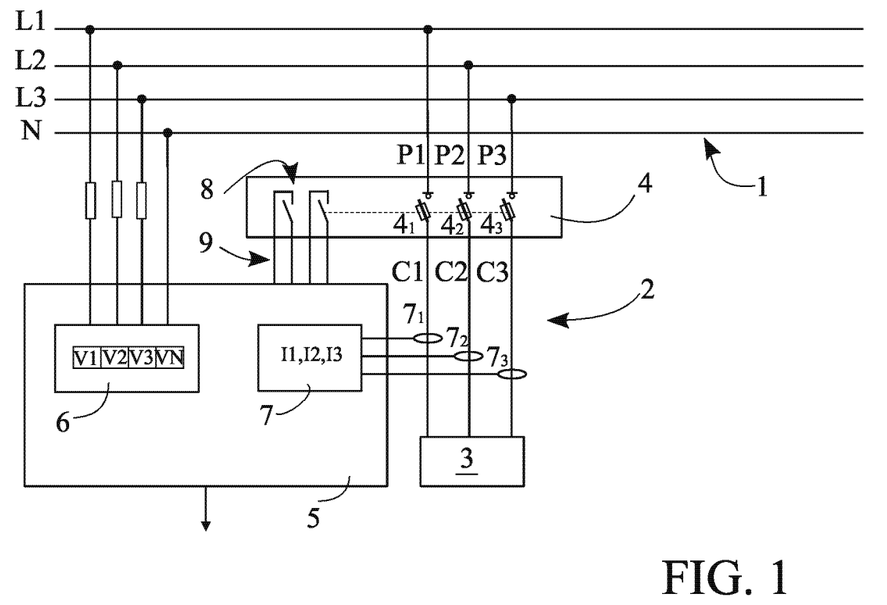
FIG. 1 is a diagram of an electrical installation showing the method for detecting the state of an electrical protection appliance of the prior art.

In order to better understand the advantages of the present invention, FIG. 1 diagrammatically shows an electrical installation of the prior art comprising an electrical power network 1 provided with three phases L1, L2, L3 and one neutral N, from which a network branch 2 is branched in order to supply an energy-consuming load 3, via an electrical protection appliance 4 such as a circuit breaker, however is not limited thereto. The load 3 is a three-phase load powered by three conductors C1, C2, C3 branched off of the phases L1, L2, L3 of the network 1. In such a case, the protection appliance 4 comprises three poles P1, P2, P3, each provided with a moving contact $4_1$, $4_2$, $4_3$. The electrical installation comprises a processing unit 5 designed, for example, for energy metering to determine the consumption of the load 3 and/or measure electrical characteristics (current, powers, harmonics, etc.). This processing unit 5 can be equipped with a display module and/or a communication module provided with a wired or wireless connection to a central monitoring station (not shown in this figure) in order to make use of the processed data. It in particular comprises a voltage detector 6 connected to the network 1 upstream of the network branch 2 in order to detect the voltage V1, V2, V3 across the three phases L1, L2, L3 and the voltage VN across the neutral N powering the load 3. It further comprises a current measuring device 7 connected to three current sensors $7_1$, $7_2$, $7_3$, each installed on one of the conductors C1, C2, C3 of the network branch 2, downstream of the protection appliance 4 and upstream of the load 3, in order to detect the current I1, I2, I3 across said load 3. For the energy metering in said electrical installation shown, the voltage detection and the current detection correspond to real and accurate measurements of the value of the voltage V and of the current I powering the load 3. Of course, this example is not limiting.

In accordance with the known detection method, the protection appliance 4 further comprises auxiliary contacts 8, in particular two auxiliary contacts 8, mechanically linked to the moving contacts $4_1$, $4_2$, $4_3$ of the protection appliance 4 and electrically connected to the processing unit 5 via a cabling 9. One of the auxiliary contacts 8 is representative of the open or closed state of the moving contacts of the protection appliance 4 and the other auxiliary contact 8 is representative of the trip state of the protection appliance 4. For this purpose, the processing unit 5 comprises an identification of the state of the auxiliary contacts 8 providing the operator with information both regarding the open or closed state of said protection appliance 4 and regarding the possible tripping thereof. The processing unit 5 can also be capable of identifying the assumed cause of the tripping of the protection appliance 4 as a function of the tripping characteristics and of the value of the current at the time of said trip.

Figure 2:
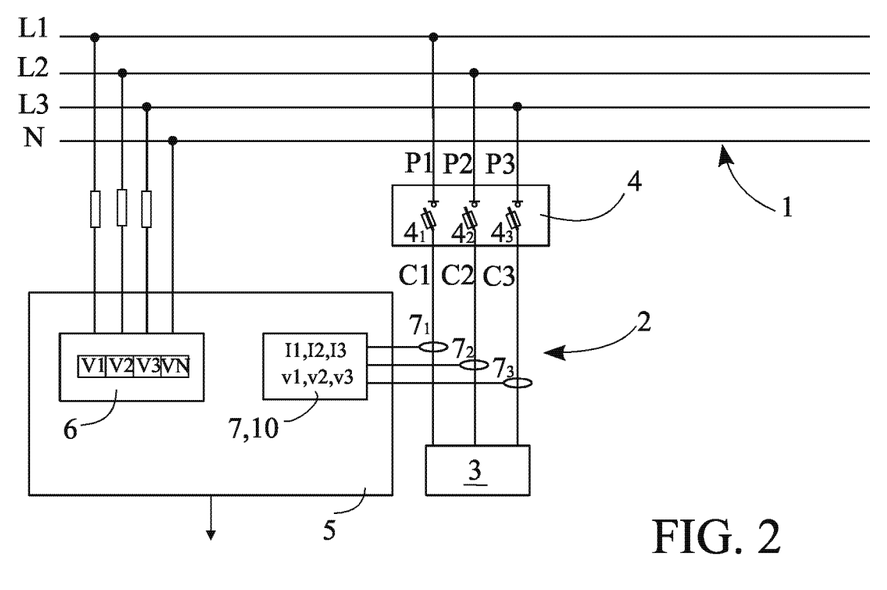
FIG. 2 is a diagram of an electrical installation showing the method for detecting the state of an electrical protection appliance according to the invention.

FIG. 2 diagrammatically shows an electrical installation according to the invention comprising the same configuration as that described with reference to FIG. 1, with the exception that the protection appliance 4 thereof does not comprise any auxiliary contacts or cabling for these contacts to the processing unit 5, which significantly simplifies the cabling for the installation, and reduces the overall dimensions of the appliance and the volume occupied in the electrical cabinet. It further comprises a voltage detector 10 for detecting the voltage v1, v2, v3 across the conductors C1, C2, C3 of the network branch 2 supplying the load 3 downstream of the protection appliance 4. In the example shown, the voltage detector 10 is integrated into the current measuring device 7. This example is not limiting since it could be separate therefrom.

In order to implement the detection method according to the invention, information must be obtained regarding the presence of voltage V upstream of the protection appliance 4 and of voltage v downstream thereof The current measurement I is not necessary, however it allows additional information to be obtained, as explained below. This information is used by the processing unit 5, which in particular comprises analogue conditioning circuits, analogue-to-digital conversion circuits and a computation unit controlled by suitable software.

The information regarding the presence of the voltage V upstream of the protection appliance 4 and of the voltage v downstream thereof can be obtained by a measurement, however an approximate or representative value, for example given by an estimate or an image, can suffice, as explained below. For this purpose, the voltage signals transmitted by the voltage detectors 6 and 10 in FIG. 2 that already exist in the electrical installation are used, without requiring the addition of specific equipment or additional cabling.

The upstream voltage V, or reference voltage, can be measured or detected either directly upstream of the protection appliance 4, or remotely at the main switchboard by a voltage detector 6 (see FIG. 2).

The downstream voltage v, that may or may not be associated with the current measuring device 7, can be measured or detected, with or without contact, via a voltage detector 10 (see FIG. 2). It can, for example, comprise an electrode placed inside the current measuring device 7 which provides a voltage image that is very inaccurate in terms of amplitude but relatively accurate in terms of phase.

These examples are not limiting in nature. More specifically, depending on the type of voltage detectors 6, 10 provided in the electrical installation, the voltage signal obtained can be either an image of the upstream voltage V and/or of the downstream voltage v, which consists of a voltage signal of the same sine-wave form as the voltage V, v of the network, but not having the same voltage value or an inaccurate voltage value, or it can be an accurate measurement of the voltage V, v. If one and/or the other of these detectors 6, 10 is constituted by a voltage tap in the form of a tap on each of the phases L1, L2, L3 of the network 1 and/or on each of the conductors C1, C2, C3 of the network branch 2, or by a non-contact voltage sensor such as a capacitive coupling or an electric field measurement, then the voltage signal obtained is an image representative of the voltage V, v. This voltage image can be very inaccurate in terms of amplitude, given that it is not used to measure the real voltage V, v, but the form thereof is close to the real voltage signal and the time offset thereof with the real voltage signal is relatively low, in the order of a few degrees phase shift relative to the network frequency equal to 50 Hz for example. If one and/or the other of these detectors 6, 10 is constituted by a resistive sensor, with or without perforation of the insulator of the conductor to which said sensor is coupled, then the voltage signal transmitted is an accurate measurement of the voltage V, v between one or more phases L1, L2, L3 and a reference potential, or between one or more conductors C1, C2, C3 and a reference potential, the reference potential capable of being, for example, the ground or the neutral N. A non-contact voltage detection solution will be preferred, which has the advantage of not requiring any cabling, of being simple to implement, inexpensive and very easy to deploy, in particular in an installation having a plurality of distribution levels. This non-contact voltage detection can be provided either upstream or downstream, or even upstream and downstream of the protection appliance 4. A preferred solution can be a voltage measurement upstream and a non-contact voltage detection downstream.

Determining the Open or Closed State of a Protection Appliance

Using the information regarding the presence of voltage V upstream of the protection appliance 4 and regarding the presence of voltage v downstream thereof, the following four states of the protection appliance 4 can be identified:

Upstream voltage V present and downstream voltage v present:
  The protection appliance 4 is in a closed state.
Upstream voltage V present and downstream voltage v absent:
  The protection appliance 4 is in an open state.
Upstream voltage V absent and downstream voltage v present:
  The protection appliance 4 is in an open state and there is feedback from the load 3.
Upstream voltage V absent and downstream voltage v absent:
  The protection appliance 4 is in an undetermined state.

Figure 4:
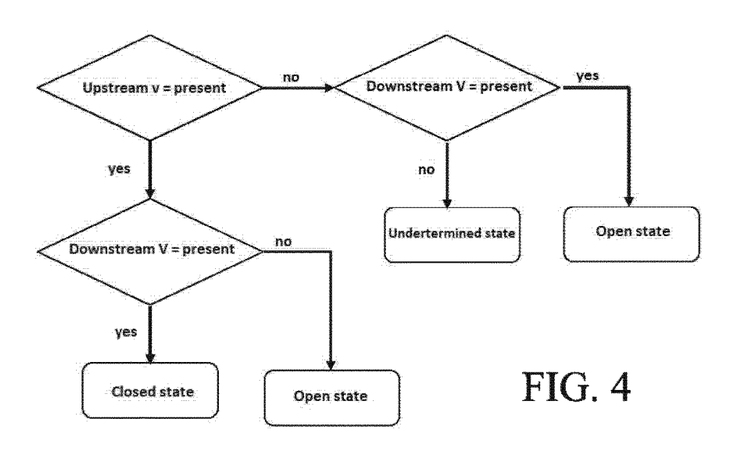
FIG. 4 is a flow chart showing the logic for determining the open or closed state of a pole of a protection appliance.

The logic for processing the information regarding the presence or absence of the voltage V upstream of the protection appliance 4 and the voltage v downstream thereof is shown by the flow chart in FIG. 4. This logic clearly applies to each pole P1, P2, P3 of said protection appliance 4, regardless of the number of poles.

In the case of a polyphase protection appliance 4, for example a three-phase protection appliance as shown, and if the upstream voltages V1, V2, V3 are compared with the downstream voltages v1, v2, v3 across each of the conductors, and thus across each of the poles P1, P2, P3, the following state of the protection appliance 4 can also be identified:

Upstream voltage V1, V2, V3 present and downstream voltage v1, v2, v3 absent across certain poles P1, P2 and/or P3:
  The protection appliance 4 is in an incomplete open state—which can be the case for a protection appliance of the fuse or fused interrupter switch type, but also in the case of a broken appliance of the switch or circuit breaker type.

The information regarding the presence or absence of voltage V, v can be dependent on a voltage threshold below which the voltage is considered to be absent.

Figure 6:
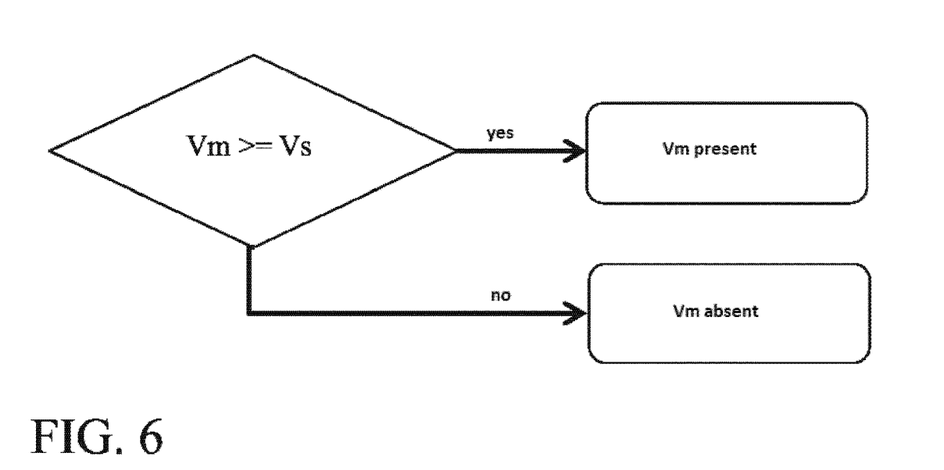
FIG. 6 is a step of the flow chart in FIG. 4 for determining the presence or absence of voltage from a measured voltage value.

In order to determine whether the upstream voltage V is present or absent, a voltage measurement obtained by the voltage detector 6 is used in this case. The measured voltage value Vm is thus compared with a threshold value Vs. If the measured voltage value Vm is greater than or equal to the threshold value Vs, then the voltage Vm is considered to be present and equal to 1, otherwise it is considered to be absent and equal to 0, in a binary system. The threshold value Vs can be, for example, equal to 50V, however is not limited to this value. The flow chart in FIG. 6 shows this processing logic. It goes without saying that this processing logic applies in a similar manner to determine whether the downstream voltage v is present or absent, if a voltage measurement obtained by the voltage detector 10 is available.

In order to determine whether the downstream voltage v is present or absent, the voltage detection obtained by the voltage detector 10 is used. If this is a detection by non-contact capacitive coupling and the minimum coupling capacity level is known, which can range from a fraction of picofarads to several tens of picofarads, then a threshold can be set, below which the downstream voltage v is considered to be absent. If information regarding the presence of current powering the load 3 obtained by the current measuring device 7 is also available, the value of the coupling capacity can be estimated when the current I is present. The current I is considered to be present if it lies within a normal working range, i.e. not too low so as not to be confused with noise, nor too high so as not to attempt calibration in a short-circuit situation that could cause a significant voltage sag. When the current I lies within this so-called normal working range, for example between 10% and 100% of the nominal current I, this means that the protection appliance 4 is in the closed position and that the voltage v present across the conductor C1, C2, C3 downstream of the protection appliance 4 is very close to the upstream voltage level V. Under these conditions, a relation can be established between the output level Vdet of the non-contact voltage detector 10 and the real voltage level V present upstream. For example, if the upstream voltage measured is V=230V, the current I is in the normal working range, and the output level of the voltage detector 10 is Vdet=23 mV, then the following relation is obtained: v=Vdet*230V/23 mV=Vdet*1000. If Vdet=10 mV is obtained, then it can be deduced that the downstream voltage is v=100V. This output level Vdet of the voltage detector 10 corresponding to a closed state can thus be stored in memory and a suitable voltage threshold Vs can be set, for example 50% (or any other percentage) of the output level Vdet stored in memory in order to declare an absence of the downstream voltage $\underline{v}$. In this manner, the information regarding the presence/absence of the downstream voltage $\underline{v}$ is made more reliable. More specifically, without this in-line calibration operation, the variation in the coupling capacity of the non-contact voltage detector 10 is such that these 10 mV could correspond equally to 50V or to 200V and thus make the detection of the presence or absence of downstream voltage $\underline{v}$ very random. To summarise, the current value I measured by the current measuring device 7 is advantageously used as a calibration means to determine the normal or nominal value of the voltage V, $\underline{v}$ upstream and/or downstream of the protection appliance 4 and to set, based on this normal or nominal voltage value, a voltage threshold Vs below which the upstream voltage V and/or the downstream voltage $\underline{v}$ is considered to be absent. A "normal voltage value" is understood to be a voltage value close to the nominal voltage value. Thus, the expression "nominal voltage value" used in the present application must not be interpreted in a restrictive manner, since it indifferently denotes both notions, i.e. a "normal" value or a "nominal" value of the voltage.

Figure 5:
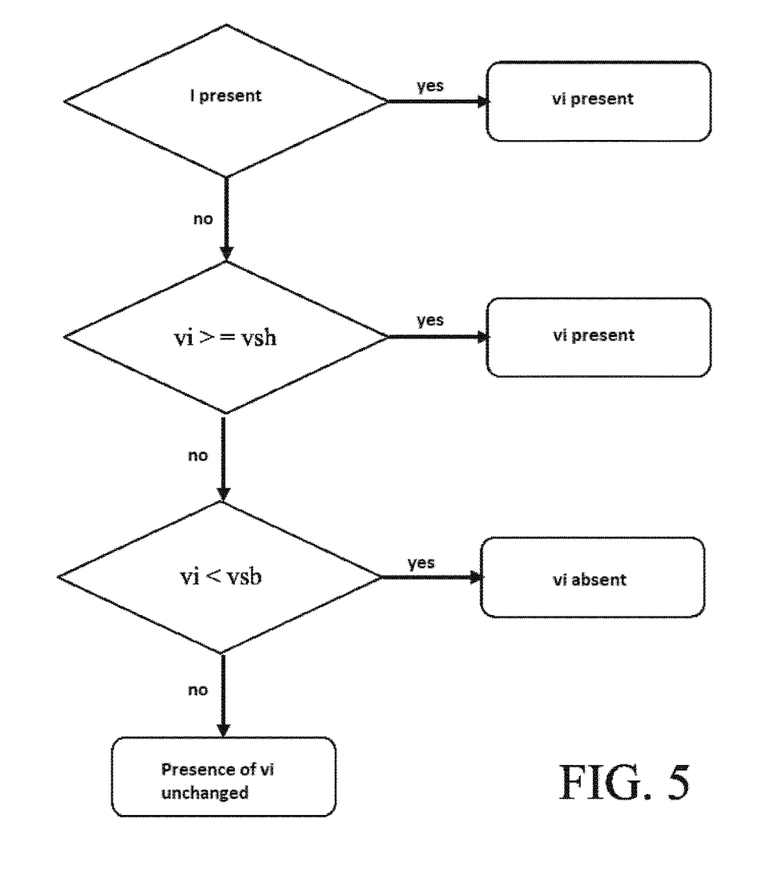
FIG. 5 is a step of the flow chart in FIG. 4 for determining the presence or absence of voltage from a voltage image.

FIG. 5 shows this scenario in the form of a flow chart which provides for two voltage threshold levels, i.e. an upper threshold value vsh corresponding to a function of the nominal voltage and a lower threshold value vsb that is, for example, equal to 80% of the upper threshold vsh. Of course, these examples of threshold values are not limiting. In such a case, the value of the voltage image vi is compared with a threshold value vs. In the presence of a current I powering a load 3, the voltage vi is present. In the absence of a current powering a load 3, and if the value of the voltage image vi is greater than or equal to the upper threshold value vsh, then the voltage vi is considered to be present and equal to 1, otherwise it is compared with the lower threshold value vsb. If the value of the voltage image vi is less than the lower threshold value vsb, then the voltage vi is considered to be absent and equal to 0, otherwise the voltage vi is considered to be present and equal to 1 in a binary system. Of course, this processing logic applies in a similar manner to determine whether the upstream voltage V is present or absent, if only a voltage detection obtained by the voltage detector 6 is available with no voltage measurement.

In a second alternative embodiment, and depending on the type of protection appliance 4, the magneto-thermal tripping curve of said protection appliance 4 could be emulated and the cause of opening: overload or short-circuit, could be determined, as a function of the zone of the curve that is applicable when the protection appliance 4 is tripped. For example, if the current I at the time of opening lies between a first threshold S1 and a second threshold S2 that is greater than the first threshold S1, then an overload is considered to be present, and if said current I is greater than S2, then a short-circuit is considered to be present. If the current I at the time of opening is less than S1, then the case of deliberate opening (manually or via a control action) is a priori considered to apply. Of course, these thresholds must be adjusted as a function of the available knowledge of the protection appliance 4. If in the presence of a differential protection appliance, a measurement of said differential current must be obtained so as to discriminate between a deliberate opening and an opening caused by a fault.

Determining the Cause of the Open State of a Protection Appliance

The additional measurement of the current I also allows the type of opening and the cause of the tripping of the protection appliance 4 to be determined according to the value of the current measured:

Opening in the presence of a current I less than a first threshold corresponding, for example, to 10% of nominal I (In):
Deliberate opening of the protection appliance 4 by a manual or remote control action, no load operation Opening in the presence of a current I less than or equal to a second threshold corresponding, for example, to 110% of nominal I (In):
Deliberate opening of the protection appliance 4 by a manual or remote control action, on load operation Opening in the presence of a current I greater than a third threshold corresponding, for example, to 110% of nominal I (In):
Opening of the protection appliance 4 as a result of an overload current Opening in the presence of a current I greater than or equal to a fourth threshold corresponding, for example, to 300% of nominal I (In):
Opening of the protection appliance 4 as a result of a short-circuit current.

Figure 7:
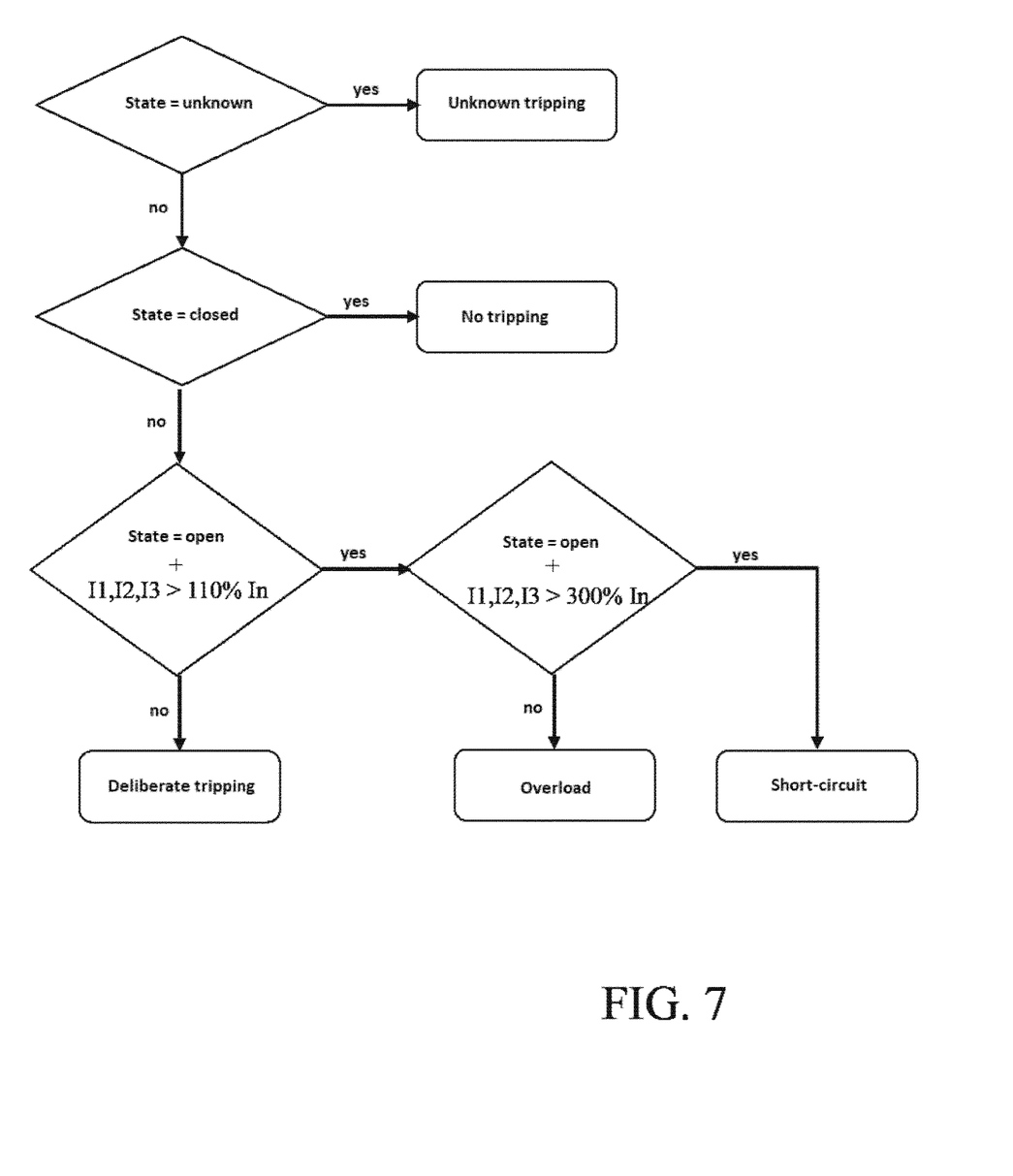
FIG. 7 is a flow chart showing the logic for identifying the cause of the open state of a protection appliance.

The processing logic is shown by a flow chart in FIG. 7 as a function of the state of the protection appliance 4 determined during the first processing phase shown by the flow chart in FIG. 4. Only the open state of the protection appliance 4 requires information on the cause of the tripping thereof. This is why the first two levels of the flow chart in FIG. 7 do not give rise to the determination of a cause, on the one hand, if the protection appliance 4 is in an undetermined state, and on the other hand, if the protection appliance 4 is in a closed state. However, if the protection appliance 4 is in the open state, the level of the intensity I passing through the conductors C1, C2, C3 powering the load 3 should be checked via the current measuring device 7 at the time of opening. If the measured value of the current I1, I2, I3 is greater than the overload threshold, for example equal to 110% of nominal I (In), then it is checked whether this value is also greater than the short-circuit threshold, for example equal to 300% of nominal I (In). If the answer is yes, then the protection appliance 4 is tripped and the cause of the tripping thereof is a short-circuit. If the answer is no, then the protection appliance 4 is tripped and the cause of the tripping thereof is an overload. If the measured value of the current I1, I2, I3 is less than 110% of nominal I (In), then the protection appliance 4 is not tripped and the cause of the opening thereof is a deliberate and non-accidental control action.

Implementing the Detection Method of the Invention

Figure 3:
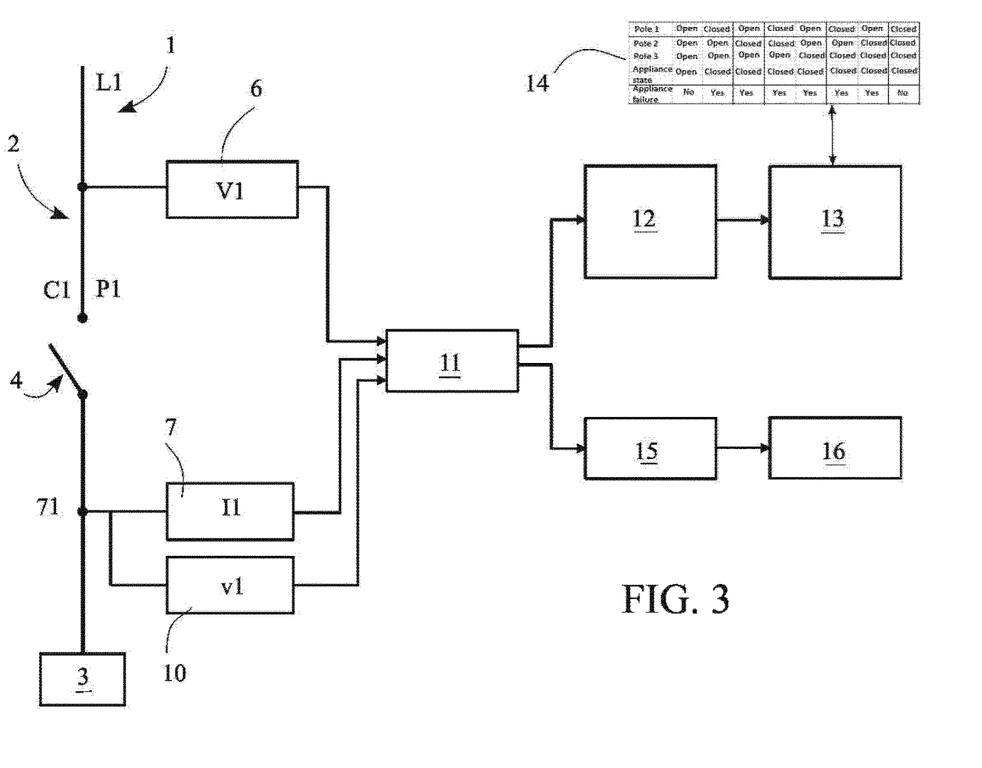
FIG. 3 is a functional diagram of the detection device of the invention.

FIG. 3 illustrates the functional diagram of the detection device allowing the detection method according to the invention to be implemented. It represents the function modules implemented to detect the open or closed state of a protection appliance 4, in addition to the cause behind the opening thereof. The protection appliance 4 is symbolised by a single pole P1 mounted on a single phase L1 and a single conductor C1 between a network 1 and a load 3.

In a first processing phase, the upstream voltage signal V1 and downstream voltage signal v1 transmitted by the voltage detectors 6 and 10 are sent to a voltage presence determination module 12 allowing, by binary processing of said signals, preferably carried out by a software function, however not limited thereto since any other cabled logic or analogue comparison system could be suitable, it to be identified whether each of the voltages V1 and v1 is present or absent. This binary result is then sent to a correlation module 13 which, as a function of a truth table 14 corresponding to the type of protection appliance 4 concerned, transmits information regarding the state of said appliance: open, closed or in error. The type of protection appliance 4 is a parameter provided by the user and input into the suitable software contained in the processing unit 5. A truth table 14 corresponding to each of the types of known protection appliance 4 can be available in said suitable software.

In a second processing phase, which can take place in parallel and simultaneously with the first processing phase, the measurement of the current I1 transmitted by the current measuring device 7 is sent to a computation module 15 allowing a root-mean-square value of the current I1 to be transmitted, which is then sent to a comparison module 16 for comparing the root-mean-square value of the current I1 with different current thresholds and for determining whether the opening of the protection appliance 4 is normal or accidental following an overload or a short-circuit. This computation module 15 and comparison module 16 are preferably software functions, however are not limited thereto since any other cabled logic or analogue comparison system could be suitable. The current measuring device 7 can be formed by any known current sensor, and in particular that disclosed in the patent document WO 2015/150671 A1 by the applicant.

The voltage V1, v1 and current I1 signals transmitted by the voltage detectors 6, 10 and the current measuring device 7 can, prior to said processing phases, pass through a synchronising module 11 for bringing the sampling frequency of said signals into line in order to facilitate the analysis thereof. Any measurement sample synchronisation technique can be suitable, and in particular that disclosed in the patent document WO 2015/150670 A1 by the applicant which allows a synchronisation of the measured voltage and current samples in the order of 1 µs, i.e. ensuring an excellent metrological quality despite the possible presence of harmonics, as well as sharing the voltage detector 6 upstream of the installation.

Optionally, the processing unit 5 of the detection device can be complemented by an additional correlation module (not shown) for automatically correcting possible cabling errors in the case of voltage detectors 6, 10 with contact, thus cabled, in accordance with the solution disclosed in the patent document WO 2015/150671 A1 by the applicant.

The truth tables 14 are two-input tables which, as a function of the open or closed state of each pole P1, P2, P3 of the protection appliance 4 concerned, allow it to be determined whether the protection appliance 4 is in the open or closed state and whether the protection appliance 4 is or is not in an error state corresponding to a state that is neither fully open nor fully closed. The tables below illustrate different truth tables 14 as a function of the type of protection appliance 4 and the number of poles of this appliance.

Single-Pole Circuit Breaker:

| Pole | Open | Closed |
|---|---|---|
| Protection appliance state | Open | Closed |

2- or 3-Pole Circuit Breaker:

| Pole 1 | Open | Closed | Open | Closed | Open | Closed | Open | Closed |
|---|---|---|---|---|---|---|---|---|
| Pole 2 | Open | Open | Closed | Closed | Open | Open | Closed | Closed |
| Pole 3 | Open | Open | Open | Open | Closed | Closed | Closed | Closed |
| Appliance state | Open | Closed | Closed | Closed | Closed | Closed | Closed | Closed |
| Appliance failure | No | Yes | Yes | Yes | Yes | Yes | Yes | No |

Single-Pole Fused Interrupter Switch:

| Pole | Open | Closed |
|---|---|---|
| Protection appliance state | Open | Closed |

2- or 3-Pole Fused Interrupter Switch:

| Pole 1 | Open | Closed | Open | Closed | Open | Closed | Open | Closed |
|---|---|---|---|---|---|---|---|---|
| Pole 2 | Open | Open | Closed | Closed | Open | Open | Closed | Closed |
| Pole 3 | Open | Open | Open | Open | Closed | Closed | Closed | Closed |
| Appliance state | Open | Closed | Closed | Closed | Closed | Closed | Closed | Closed |
| Appliance failure | Yes | Yes | Yes | Yes | Yes | Yes | Yes | No |

Alternative Embodiment of the Invention

The detection method according to the invention can be extended to an electrical installation comprising a plurality of branches 2 branching off of the electrical power network 1, each branch 2 comprising a protection appliance 4 to be monitored, or a plurality of ranked distribution levels, comprising protection appliances 4 at each level, for example located in a main switchboard for the first level, in sub-main distribution boards for the intermediate levels, and in final distribution boards for the final levels.

Figure 8:
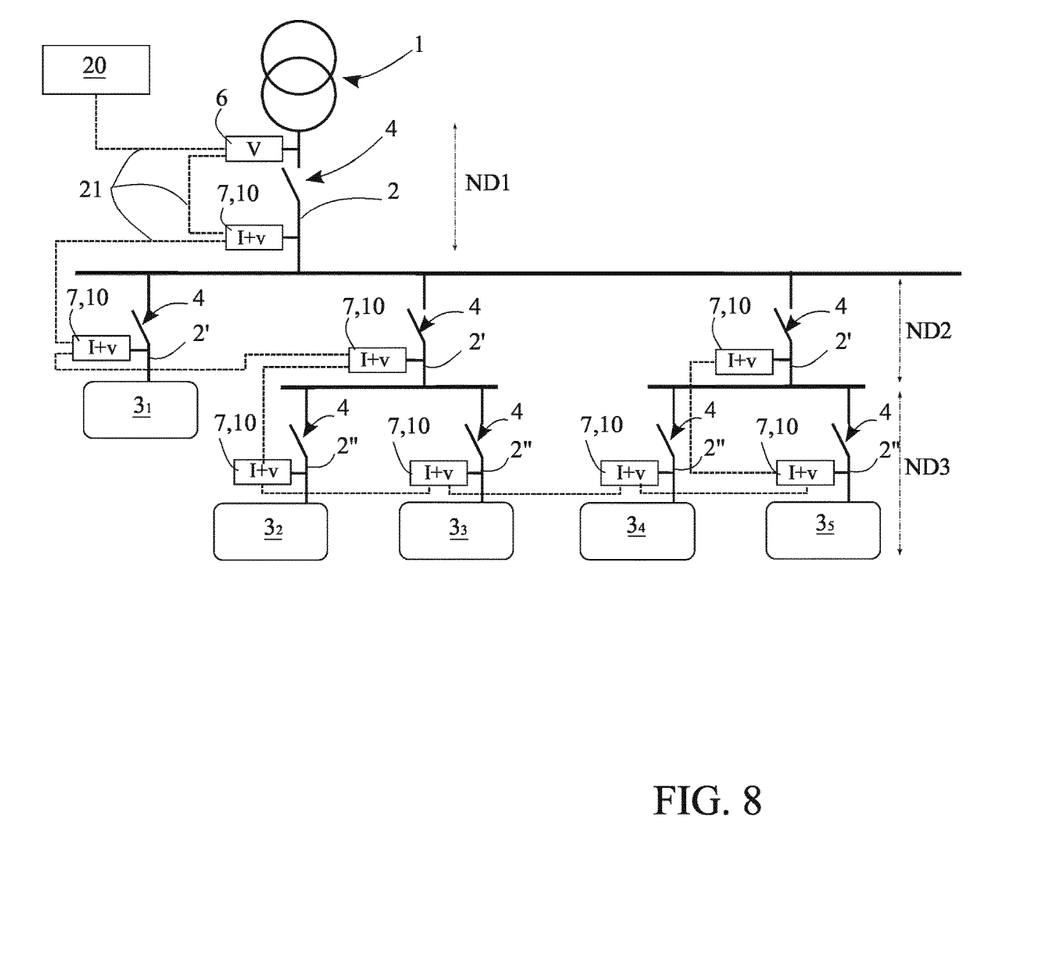
FIG. 8 is a diagram of an electrical installation having a plurality of distribution levels showing the method for detecting the state of an electrical protection appliance according to the invention.

FIG. 8 diagrammatically shows one example of an electrical installation comprising three distribution levels:

A first distribution level ND1, at the incoming end of the installation, comprising a main branch 2 powered by the network 1, symbolised by a current transformer via a main switchboard (not shown), and provided with a protection appliance 4, an upstream voltage detector 6 and a current measuring device 7 integrating a downstream voltage detector 10, A second distribution level ND2, downstream of the first level ND1, comprising three intermediate distribution branches 2' originating from the main branch 2 via a sub-main distribution board (not shown), and each provided with a protection appliance 4, an upstream voltage detector 6 and a current measuring device 7 integrating a downstream voltage detector 10, only one of the distribution branches 2' powering a load $3_1$, A third and final distribution level ND3, downstream of the second level ND2, comprising four final distribution branches 2" originating from two of the intermediate distribution branches 2' via a final distribution board (not shown), and each provided with a protection appliance 4, an upstream voltage detector 6 and a current measuring device 7 integrating a downstream voltage detector 10, and powering each load $3_2$, $3_3$, $3_4$ and $3_5$.

In this installation configuration, a single measurement or a single detection of the upstream voltage V is provided by a single voltage detector 6 common to the entire installation and provided at the main switchboard at the incoming end of the installation. The detection of the upstream voltage V is thus advantageously shared, in accordance with the solution disclosed in the patent document WO 2015/150670 A1 by the applicant, and is transmitted via a communication bus 21, on the one hand to a central monitoring station 20 and on the other hand to the different processing units 5 (merged with the current measuring device 7 and the downstream voltage detector 10) in the different branches 2, 2', 2" and at the different distribution levels ND1, ND2, ND3. Moreover, a measurement or a detection of the downstream voltage v̲ downstream of each protection appliance 4 protecting the loads $3_1$, $3_2$, $3_3$, $3_4$ and $3_5$ is provided in a sub-main distribution board or a final distribution board depending on the position of the load in the distribution levels ND2, ND3.

By using the common information regarding the presence of the upstream voltage V in the main switchboard and the presence of the downstream voltage v̲ downstream of the protection appliance 4 of the load $3_1$, $3_2$, $3_3$, $3_4$ and $3_5$ considered, the following four states of the protection appliances 4 connected in series can be determined:

Upstream voltage V in the main switchboard present and downstream voltage v̲ present:
All protection appliances 4 between the main switchboard and the load considered are closed
Upstream voltage V in the main switchboard present and downstream voltage v̲ absent:
One or more protection appliances 4 between the main switchboard and the load considered are open
Upstream voltage V in the main switchboard absent and downstream voltage v̲ present:
One or more protection appliances 4 between the main switchboard and the load considered are open and there is feedback from said load
Upstream voltage V in the main switchboard absent and downstream voltage v̲ absent:
The states of the protection appliances 4 between the main switchboard and the load considered are undetermined.

If the voltage detectors 10 are provided at each distribution level ND1, ND2, ND3 of the installation, the exact determination of the location at which the protection appliance 4 is in the open state will be based on the information regarding the presence of voltage at each level in accordance with the procedure described above.

If the voltage presence information is not provided at each distribution level, but if the current passing through the upstream protection appliance 4 is known, the location at which the protection appliance 4 is in the open state can be narrowed down:

If this current is not zero, it is the downstream protection appliance 4 that is in the open state, and
If this current is zero, the location at which the protection appliance 4 is in the open state is undetermined.

It is clear from the above description that the detection device and method according to the invention allow comprehensive, precise and real-time diagnostics to be obtained regarding the functioning of the electrical installation, a mapping of this installation to be established, in particular when it comprises a plurality of distribution levels, the one or more protection appliances 4 in an error state to be identified, and interventions to take place in a highly targeted manner. Moreover, non-contact voltage detection promotes the deployment of the invention in all types of installation, including multi-level installations by drastically reducing the corresponding cabling errors and overall dimensions.

The present invention is not limited to the example embodiments described herein, but encompasses all amendments and alternatives that are clear to a person skilled in the art.

The invention claimed is:

1. A method for detecting an open or closed state of an electrical protection appliance in an electrical installation for powering an energy-consuming load, said installation comprising an upstream voltage detector and a downstream voltage detector respectively disposed upstream and downstream of said protection appliance, and a current measuring device adapted to detect current passing through said load, characterised in that said method comprises the following steps: using voltages provided by said voltage detectors to obtain information regarding the presence or absence of upstream voltage and regarding the presence or absence of downstream voltage of said protection appliance, setting a voltage threshold in order to identify whether each of the voltages is present or absent, below which voltage threshold the upstream voltage and/or downstream voltage of said protection appliance is considered to be absent, using a current value measured by said current measuring device to determine, by calibration, a calibrated voltage value of the upstream voltage and/or downstream voltage of said protection appliance and to set said voltage threshold based on the calibrated voltage value, establishing a correlation between said voltages and a truth table corresponding to a type of protection appliance concerned, determining whether said protection appliance is in an open state, in a closed state, in an abnormal state or in an undetermined state wherein the upstream voltage and the downstream voltage are absent, and using the current value measured by said current measuring device to determine a cause of opening of said protection appliance between a deliberate opening and an accidental opening caused by an overload or a short-circuit.

2. The method according to claim 1, wherein said electrical protection appliance comprises a plurality of poles and said installation comprises, on each of the poles an upstream voltage detector and a downstream voltage detector respectively disposed upstream and downstream of said protection appliance, characterised in that said method comprises the additional steps of: using the voltages provided by said voltage detectors, pole by pole, to obtain information regarding the presence or absence of upstream voltage and regarding the presence or absence of downstream voltage of said protection appliance, comparing the voltages pole by pole, and determining whether said protection appliance is in an incomplete open state wherein the upstream voltage is present across all poles and the downstream voltage is absent across certain poles.

3. The method according to claim 1, wherein said electrical installation comprises a plurality of electrical protection appliances, a single upstream voltage detector disposed upstream of the plurality of protection appliances to provide a voltage common to said plurality of protection appliances, and a downstream voltage detector disposed downstream of each of the plurality of protection appliances, characterised in that said method comprises the additional steps of: using the voltages provided by said voltage detectors to obtain information regarding the presence or absence of the common upstream voltage of the plurality of protection appliances and regarding the presence or absence of the individual downstream voltage of each of the plurality of protection appliances, and determining an individual state of each of the plurality of protection appliances.

4. The method according to claim 3, wherein said electrical installation comprises two ranked distribution levels, a first level powered by a main switchboard and a second level powered by a final distribution board, each distribution level comprising at least one electrical protection appliance, said installation comprising a single upstream voltage detector disposed upstream of said at least one protection appliance of the first level and a downstream voltage detector disposed downstream of said at least one protection appliance of the second level, characterised in that said method comprises the additional steps of: using the voltages provided by said voltage detectors to obtain information regarding the presence or absence of the common upstream voltage of said first level and regarding the presence or absence of downstream voltage of said second level, and determining the individual state of at least a part of said protection appliances.

5. The method according to claim 3, wherein said electrical installation comprises a plurality of ranked distribution levels, a first level powered by a main switchboard, a plurality of intermediate levels powered by sub-main distribution boards, and a final level powered by a final distribution board, each distribution level comprising at least one electrical protection appliance, said installation comprising a single upstream voltage detector disposed upstream of said at least one protection appliance of the first level and a downstream voltage detector disposed downstream of said at least one protection appliance of the final level, characterised in that said method comprises the additional steps of: using the voltages provide by said voltage detectors to obtain information regarding the presence or absence of the common upstream voltage of said first level and regarding the presence or absence of downstream voltage of said final level, and determining the individual state of at least a part of said protection appliances.

6. The method according to claim 5, wherein said installation further comprises a downstream voltage detector disposed downstream of said at least one protection appliance of each intermediate level, characterised in that said method comprises the additional steps of: using the voltages provided by said voltage detectors to obtain information regarding the presence or absence of downstream voltage of said at least one protection appliance of each intermediate level, and determining the individual state of each of said protection appliances of said intermediate levels.

7. The method according to claim 1, wherein said upstream voltage detector and said downstream voltage detector are voltage presence sensors and/or voltage measurement sensors, characterised in that said method comprises the additional step of using voltage images viewed and/or voltage values measured by said voltage detectors.

8. The method according to claim 7, characterised in that non-contact sensors are used as the upstream voltage detector and/or downstream voltage detector.

9. The method according to claim 1, characterised in that a voltage value measured by said corresponding voltage detector is used, and in that said measured voltage value is compared with said voltage threshold to determine whether the voltage is present or absent.

10. A device for detecting an open or closed state of an electrical protection appliance in an electrical installation for powering an energy-consuming load, said installation comprising an upstream voltage detector and a downstream voltage detector respectively disposed upstream and downstream of said protection appliance, and a current measuring device adapted to detect current passing through said load, characterised in that said device comprises a processing unit adapted to use voltages provided by said voltage detectors and obtain information regarding the presence or absence of upstream voltage and regarding the presence or absence of downstream voltage of said protection appliance, in that in order to identify whether each of the voltages is present or absent, said processing unit comprises a voltage presence determination module adapted to compare said voltages provided by said voltage detectors with a voltage threshold value below which the voltage are considered to be absent, and to use a current value measured by said current measuring device to determine, by calibration, a calibrated value of the upstream voltage and/or downstream voltage of said protection appliance and set said voltage threshold based on the calibrated voltage value, in that said processing unit comprises a module for correlating said voltages, comprising at least one truth table corresponding to at least one type of protection appliance and adapted to determine whether said protection appliance is in an open state, in a closed state, in an abnormal state or in an undetermined state, in that said processing unit is adapted to use the current value measured by said current measuring device and comprises a comparison unit adapted to compare said measured current value with different current thresholds to determine a cause behind opening of said protection appliance from a deliberate opening and an accidental opening caused by an overload or a short-circuit, and communication means adapted to transmit information regarding the state of said protection appliance to a central monitoring station, and if said protection appliance is in an open state, the cause behind the opening.

11. The device according to claim 10, wherein said electrical protection appliance comprises a plurality of poles and said installation comprises, on each of the poles an upstream voltage detector and a downstream voltage detector respectively disposed upstream and downstream of said protection appliance, characterised in that said processing unit is adapted to use the voltages provided by said voltage detectors, pole by pole, and obtain information regarding the presence or absence of upstream voltage and regarding the presence or absence of downstream voltage of said protection appliance, and in that said module for correlating the voltages is adapted to compare said voltages, pole by pole, and further determine whether said protection appliance is in an incomplete open state.

12. The device according to claim 10, wherein said electrical installation comprises a plurality of electrical protection appliances, a single upstream voltage detector disposed upstream of the plurality of protection appliances adapted to provide a voltage common to said plurality of protection appliances, and a downstream voltage detector disposed downstream of each of the plurality of protection appliances, characterised in that said processing unit is adapted to use the voltages provided by said voltage detectors, to obtain information regarding the presence or absence of the common upstream voltage of the plurality of protection appliances and regarding the presence or absence of the individual downstream voltage of each of the plurality of protection appliances, and in that said correlation module is adapted to determine an individual state of each of the plurality of protection appliances.

13. The device according to claim 12, wherein said electrical installation comprises two ranked distribution levels, a first level powered by a main switchboard and a second level powered by a final distribution board, each distribution level comprising at least one electrical protection appliance, said installation comprising a single upstream voltage detector disposed upstream of said at least one protection appliance of the first level and a downstream voltage detector disposed downstream of said at least one protection appliance of the second level, characterised in that said processing unit is adapted to use the voltages provided by said voltage detectors, to obtain information regarding the presence or absence of the common upstream voltage of said first level and regarding the presence or absence of downstream voltage of said second level, and in that said correlation module is adapted to determine the individual state of at least a part of said protection appliances.

14. The device according to claim 12, wherein said electrical installation comprises a plurality of ranked distribution levels, a first level powered by a main switchboard, a plurality of intermediate levels powered by sub-main distribution boards, and a final level powered by a final distribution board, each distribution level comprising at least one electrical protection appliance, said installation comprising a single upstream voltage detector disposed upstream of said at least one protection appliance of the first level and a downstream voltage detector disposed downstream of said at least one protection appliance of the final level, characterised in that said processing unit is adapted to use the voltages provided by said voltage detectors, to obtain information regarding the presence or absence of the common upstream voltage of said first level and regarding the presence or absence of downstream voltage of said final level, and in that said correlation module is adapted to determine the individual state of at least a part of said protection appliances.

15. The device according to claim 14, wherein said installation further comprises a downstream voltage detector disposed downstream of said at least one protection appliance of each intermediate level, characterised in that said processing unit is adapted to further use the voltages provided by said voltage detectors, to obtain information regarding the presence or absence of downstream voltage of said at least one protection appliance of each intermediate level, and in that said correlation module is adapted to determine an individual state of each of said protection appliances of each of the intermediate levels.

16. The device according to claim 10, characterised in that said upstream voltage detector and said downstream voltage detector are chosen from voltage presence sensors and/or voltage measurement sensors, and in that said processing unit is adapted to use voltage images viewed and/or voltage values measured by said voltage detectors.

17. The device according to claim 16, characterised in that said upstream voltage detector and/or said downstream voltage detector are non-contact sensors.

18. The device according to claim 10, characterised in that said processing unit further comprises a synchronisation module adapted to bring into line the sampling frequency of said voltage and current provided by said voltage detectors and by said current measuring device.

* * * * *